United States Patent
Thomas

Patent Number: 6,074,929
Date of Patent: Jun. 13, 2000

[54] BOX ISOLATION TECHNIQUE FOR INTEGRATED CIRCUIT STRUCTURES

[75] Inventor: Michael E. Thomas, Milpitas, Calif.

[73] Assignee: National Semiconductor Corporation, Santa Clara, Calif.

[21] Appl. No.: 09/219,218

[22] Filed: Dec. 22, 1998

[51] Int. Cl.[7] .................................................. H01L 21/266
[52] U.S. Cl. ........................ 438/407; 438/423; 438/480; 438/528; 438/691; 438/694; 438/766
[58] Field of Search .................................... 438/400, 407, 438/423, 766, 691, 694, 480, 528

[56] References Cited

U.S. PATENT DOCUMENTS

| | | | |
|---|---|---|---|
| 4,704,302 | 11/1987 | Bruel et al. | 427/38 |
| 4,874,718 | 10/1989 | Inoue | 437/62 |
| 5,279,978 | 1/1994 | See et al. | 437/34 |
| 5,288,650 | 2/1994 | Sandow | 437/24 |
| 5,346,841 | 9/1994 | Yajima | 437/35 |
| 5,422,302 | 6/1995 | Yonehara et al. | 437/83 |
| 5,468,657 | 11/1995 | Hsu | 437/24 |
| 5,930,642 | 7/1999 | Moore et al. | 438/407 |

*Primary Examiner*—Benjamin L. Utech
*Assistant Examiner*—Matthew Anderson
*Attorney, Agent, or Firm*—Limbach & Limbach L.L.P.

[57] ABSTRACT

A layer of silicon oxide is first formed on the silicon substrate. A mask is then formed on the oxide layer to define at least one surface region of the oxide that is not covered by the mask and a continuous strip of mask material that extends continuously around the unmasked oxide surface region. The mask is then used to etch the oxide surface region to expose an underlying substrate surface region and, thereby creating a continuous wall of oxide around the substrate surface region. The mask is then removed and oxygen ions are implanted into the silicon substrate to define a horizontal layer of oxide ions within the substrate. The wall of oxide surrounding the substrate surface region impairs the implant of oxygen ions beneath the wall such that a continuous substantially vertical wall of oxygen ions is formed in the substrate extending from the perimeter of the horizontal oxygen ion layer to the surface of the substrate. The substrate is then heat treated to cause the oxygen ions in the substrate to react with silicon to form silicon oxide that defines a silicon oxide island on all sides except the surface of the substrate, thereby forming an electrically isolated active device region.

9 Claims, 3 Drawing Sheets

BOX ISOLATION TECHNIQUE FOR INTEGRATED CIRCUIT STRUCTURES

BACKGROUND OF THE INVENTION

1. Field of the Invention

The present invention relates to the fabrication of semiconductor integrated circuit structures and, in particular, to the use of an oxygen implant technique for generating completely isolated silicon islands.

2. Discussion of the Related Art

Fabrication of semiconductor integrated circuits involves the electrical interconnection of a large number of individually insulated circuit elements through specific interconnect paths. Thus, integrated circuit fabrication necessarily involves steps for electrically isolating the individual silicon "active areas" into which the circuit elements are built.

Perhaps the best known of the techniques that have been developed for isolating device elements is local oxidation of silicon (LOCOS) isolation. LOCOS isolation involves the formation of semi-recessed oxide in the non-active (or "field") regions of the silicon substrate.

Circuits that are of a higher circuit element density, or that must function under high voltages or in harsh environments, require more stringent isolation techniques. These techniques are generally categorized as silicon-on-insulator (SOI) isolation methods.

FIGS. 1A–1C illustrate an example of one currently-utilized SOI technique. First, as shown in FIG. 1A, oxygen ions 12 are implanted to a desired depth in the silicon substrate 10 at about 2 MeV. The silicon substrate 10 is then heat treated to cause the implanted oxygen to react with surrounding silicon to form an in-grown silicon oxide layer 14 in the bulk silicon, as shown in FIG. 1B. Trenches are then anisotropically etched into the substrate 10 to the depth of the in-grown oxide layer 14. The trenches are then filled with deposited oxide 16 which is planarized (e.g., by chemical mechanical polishing) to expose the surface of the silicon 10, as shown in FIG. 1C, thereby providing isolated silicon active device regions 18.

U.S. Pat. No. 5,346,841, issued Sep. 13, 1994, to Kotaro Yajima, discloses an isolation technique that also uses oxygen ion implantation. In the Yajima process, a mask for blocking ion implantation is formed on a silicon substrate. Oxygen ions are then implanted at an angle of about 45° while the substrate is rotated in a plane parallel to the substrate surface. This results in a conically shaped implant of oxygen ions into the silicon substrate. Subsequent heat treatment of the substrate results in oxidation of the silicon in the implanted areas to form oxide isolation for conically shaped silicon active device regions.

SUMMARY OF THE INVENTION

The present invention provides a method that utilizes implanted oxygen to form electrically isolated active device regions in a silicon substrate. In accordance with a preferred embodiment of the invention, a layer of implant impairing material, e.g. silicon oxide, is first formed on the silicon substrate. A mask is then formed on the oxide layer to define at least one surface region of the oxide that is not covered by the mask and a continuous strip of mask material that extends continuously around the unmasked oxide surface region. The mask is then used to etch the oxide surface region to expose an underlying substrate surface region and, further, such that oxide beneath the mask strip is not etched, thereby creating a continuous wall of oxide around the substrate surface region. The mask is then removed and oxygen ions are implanted into the silicon substrate to a predefined depth to define a horizontal layer of oxide ions within the substrate. The wall of oxide surrounding the substrate surface region impairs the controlled oxygen implant sufficiently such that a continuous, substantially vertical wall of oxygen ions is formed in the substrate extending from the perimeter of the horizontal oxygen ion layer to the surface of the substrate. The substrate is then heat treated to cause the oxygen ions in the substrate to react with surrounding silicon to form silicon oxide that encompasses a silicon island on all sides except the surface of the substrate, thereby defining an electrically isolated active device region.

A better understanding of the features and advantages of the present invention will be obtained by reference to the following detailed description and accompanying drawings, which set forth an illustrative embodiment in which the principles of the invention are utilized.

DETAILED DESCRIPTION OF THE INVENTION

Figure 2:
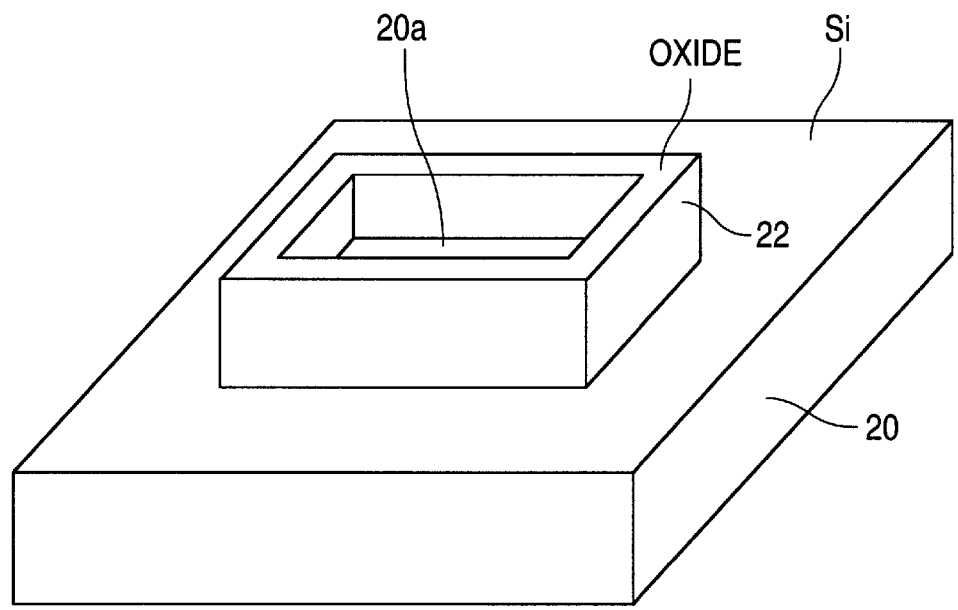
FIGS. 2, 3, 4, 5 are partial perspective drawings illustrating a box isolation technique for forming active device regions in an integrated circuit structure in accordance with the concepts of the present invention.

FIG. 2 shows a portion of a silicon substrate 20 having a continuous wall 22 of oxygen ion impairing material, e.g. silicon oxide, formed thereon. Those skilled in the art will appreciate that the silicon oxide wall 22 may be formed by first forming a layer of silicon oxide on the silicon substrate 20 and then forming a mask on the layer of silicon oxide 22, all in accordance with well-known techniques. The mask is then patterned to cover a strip of silicon oxide that extends continuously around an internal surface region of the silicon oxide that is not covered by mask material. The mask is then used to etch the silicon oxide in the internal surface region to expose a surface region 20a of the substrate 20 and, further, such that a wall 22 of silicon oxide extends continuously around the substrate surface region 20a. The mask is then removed.

Figure 3:
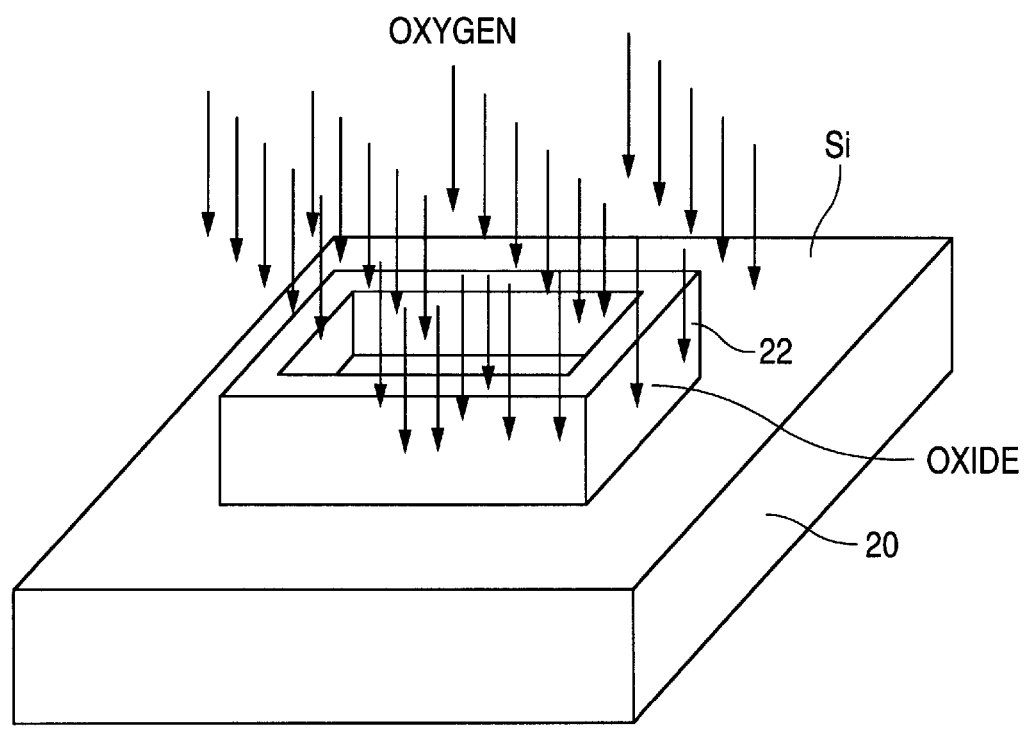
Figure 4:
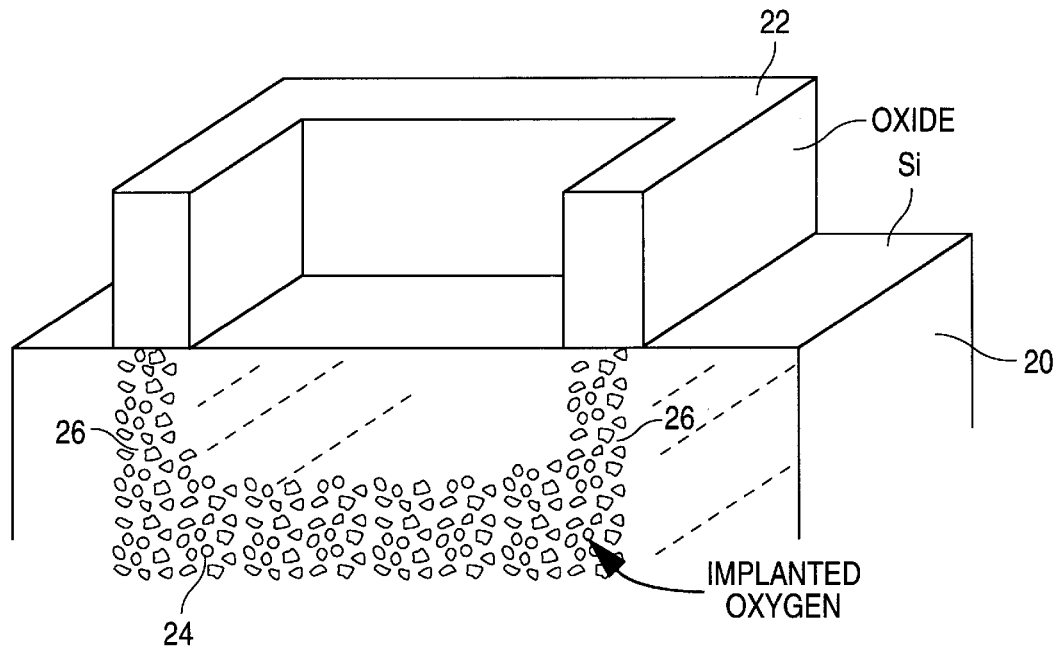

As shown in FIG. 3, oxygen ions are then implanted into the silicon substrate 20 to provide a horizontal layer 24 of oxygen ions that has a peak concentration at a predefined depth in the substrate 20 beneath the substrate surface region 20a. The wall of oxide material 22 impairs the oxygen implant such that a continuous substantially vertical wall 26 of oxygen ions is formed in the substrate 20 extending around the entire perimeter of the oxygen ion layer 24 and extending to the surface of the substrate 20, as shown in FIG. 4.

The thickness of the oxide layer 22, together with the values of the oxygen implant parameters, such as implant energy and ion density, will determine the depth of the peak implant concentration of the oxygen ion layer 24. Those skilled in the art will appreciate that oxygen implant impairing materials other than silicon oxide, for example, oxide/nitride/oxide (ONO) or photoresist can also be utilized. Those skilled in the art will also appreciate that a number of techniques can be utilized to insure the proper vertical density distribution of oxygen ions in the vertical implant regions beneath the silicon oxide wall 22. For example, the implant parameters can be varied in a controlled manner during the implant step. According to one such technique, the oxygen implant energy can be selected to initially implant oxygen at surface regions of the substrate 20 beneath the implant impairing wall 22. This will result in an initial oxygen implant in the active region at a particular depth beneath the substrate surface. The implant energy can then be gradually increased to drive the oxygen deeper into the substrate beneath the wall 22 until a continuous vertical wall of implanted oxygen is formed to at least the initial depth of the oxygen implant in the active region. Of course, this will also cause the depth of the implant in the active region to increase. Or, following the implant and after removal of the silicon oxide wall 22, the surface of the substrate can be subjected to a chemical mechanical polishing (CMP) step to remove upper portions of substrate surface that may have a lesser concentration of implanted oxygen ions in the vertical regions than is needed to achieve the desired level of active region isolation.

Figure 5:
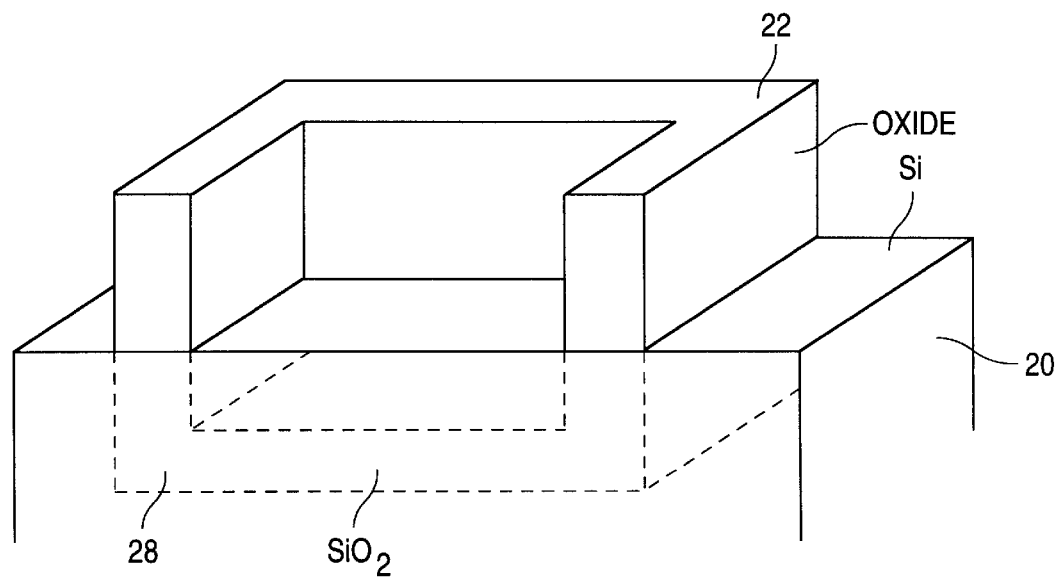

Referring to FIG. 5, following oxygen ion implantation and removal of the implant impairing wall 22, the substrate 20 is heat treated to cause the oxygen ions in the substrate 20 to react with surrounding silicon to form silicon oxide 28 that defines a silicon island on all sides except the surface region 20a of the substrate 20, thereby forming an electrically isolated active device region in the silicon substrate 20.

Figure 1A:
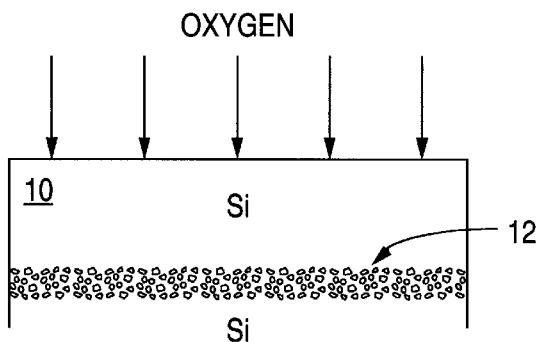
FIGS. 1A, 1B, 1C are partial cross-sectional drawings illustrating a known method of forming of a silicon-on-insulator structure utilizing implanted oxygen.
Figure 1B:
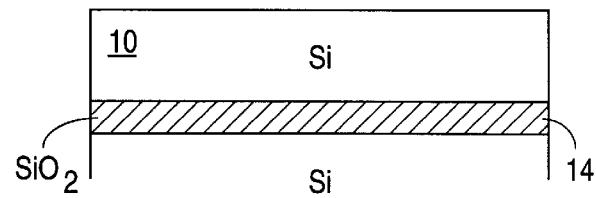
Figure 1C:
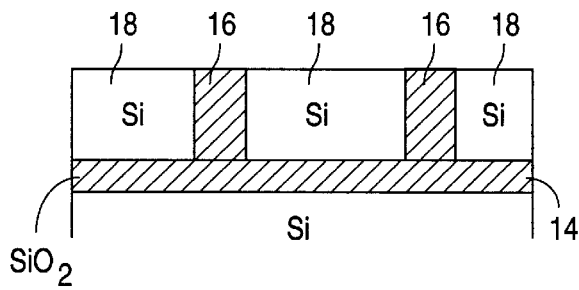
Figure 6:
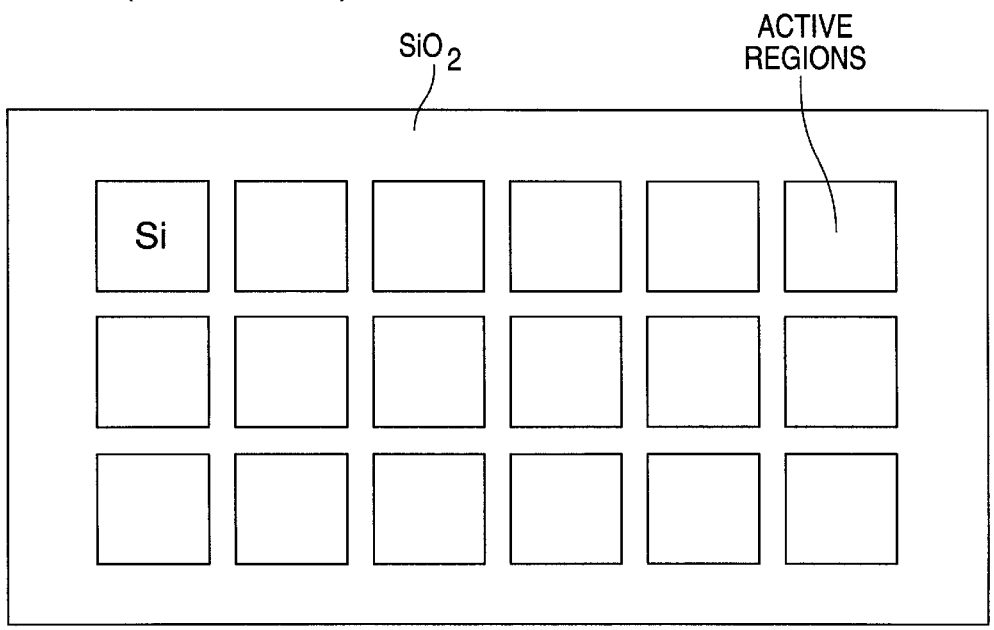
FIG. 6 is a plan view illustrating a matrix of active silicon areas electrically isolated by surrounding silicon dioxide formed in accordance with the oxygen implantation techniques of the present invention.

FIG. 6 shows a matrix of silicon islands electrically isolated by surrounding silicon dioxide material formed in accordance with the previously discussed techniques of the present invention.

It should be understood that various alternatives to the embodiments of the invention described herein may be employed in practicing the invention. It is intended that the following claims define the scope of the invention and that methods within the scope of these claims and their equivalents be covered thereby.

What is claimed is:

1. A method of fabricating electrically isolated active device regions in a silicon substrate, the method comprising:

forming a layer of implant impairing material on the silicon substrate;

forming a mask on the layer of implant impairing material such that the mask covers at least one surface region strip of implant impairing material that extends continuously around an internal surface region of implant impairing material that is not covered by the mask;

using the mask to etch the implant impairing material such that implant impairing material is etched in the internal surface region to expose an underlying substrate surface region and such that the surface region of implant impairing material that extends continuously around the internal surface region is not etched, thereby creating a continuous wall of implant impairing material around the substrate surface region;

removing the mask;

implanting oxygen ions into the silicon substrate to provide a substantially horizontal layer of oxygen ions having a peak concentration at a predefined depth in the substrate beneath the substrate surface region, the wall of implant impairing material impairing the implant of oxygen ions such that a continuous substantially vertical wall of oxygen ions is formed in the substrate extending around the entire perimeter of the horizontal oxygen ion layer and extending to the surface of the substrate; and heat treating the substrate to cause the oxygen ions in the substrate to react with silicon in the substrate to form silicon oxide in the substrate that defines a silicon oxide island on all sides except the surface of the substrate, thereby forming an electrically isolated active device region.

2. A method as in claim 1, and further comprising, following the step of implanting oxygen ions:

removing the wall of implant impairing material.

3. A method as in claim 2, and further comprising, following the step of removing the wall of implant impairing material:

performing a chemical mechanical polishing step to remove portions of the silicon substrate.

4. A method of fabricating an electrically isolated active device region in a silicon substrate, the method comprising:

forming a layer of dielectric material on the silicon substrate;

forming a mask on the layer of dielectric material such that the mask covers at least one surface region strip of dielectric material that extends continuously around an internal surface region of the dielectric material that is not covered by the mask;

using the mask to etch the dielectric material such that dielectric material is etched in the internal surface region to expose an underlying substrate surface region and such that the surface region strip that extends continuously around the internal surface region is not etched, thereby creating a continuous wall of dielectric material around the substrate surface region;

removing the mask;

implanting oxygen ions into the silicon substrate to provide a substantially horizontal layer of oxygen ions having a peak concentration at a predefined depth in the substrate beneath the substrate surface region, the wall of dielectric material impairing the implant of oxygen ions such that a continuous substantially vertical wall of oxygen ions is formed in the substrate extending around the entire perimeter of the horizontal oxygen ion layer and extending to the surface of the substrate; and heat treating the substrate to cause the oxygen ions in the substrate to react with silicon in the substrate to form silicon oxide in the substrate that defines a silicon oxide island on all sides except the surface of the substrate, thereby forming an electrically isolated active device region.

5. A method as in claim 4, and wherein the dielectric material is silicon oxide.

6. A method as in claim 4, and wherein the dielectric material is oxygen/nitride/oxide (ONO).

7. A method as in claim 4, and wherein the dielectric material is photoresist.

8. A method as in claim 4, and wherein the step of implanting oxygen comprises varying the oxygen implant parameters to form the vertical wall of oxygen ions.

9. A method as in claim 8, and wherein the step of implanting oxygen comprises varying the oxygen implant energy.

* * * * *